(12) United States Patent
Yang et al.

(10) Patent No.: US 11,946,592 B2
(45) Date of Patent: Apr. 2, 2024

(54) BRACKET

(71) Applicant: Wistron NeWeb Corporation, Hsinchu (TW)

(72) Inventors: Lan-Chun Yang, Hsinchu (TW); Bing-Chun Chung, Hsinchu (TW); Li-Hsien Peng, Hsinchu (TW); Yi-Chieh Lin, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 17/749,223

(22) Filed: May 20, 2022

(65) Prior Publication Data
US 2023/0228370 A1 Jul. 20, 2023

(30) Foreign Application Priority Data

Jan. 20, 2022 (TW) .................................. 111102429

(51) Int. Cl.
*F16M 13/02* (2006.01)
*H05K 7/02* (2006.01)

(52) U.S. Cl.
CPC ............... *F16M 13/02* (2013.01); *H05K 7/02* (2013.01)

(58) Field of Classification Search
CPC .... A47G 35/0635; A47G 29/083; B60R 7/10; H05K 7/02; F16M 13/02; G06F 1/1601
USPC ............................................ 248/223.41, 308
See application file for complete search history.

(56) References Cited

U.S. PATENT DOCUMENTS

| 5,169,062 A * | 12/1992 | Baker ................ A47G 29/1203 |
| | | 403/380 |
| 6,494,550 B1 * | 12/2002 | Chen ...................... A47B 88/43 |
| | | 312/334.7 |
| 2012/0145845 A1 * | 6/2012 | Hightower ........... A47B 88/423 |
| | | 248/223.41 |
| 2016/0213146 A1 * | 7/2016 | Gosling ............... A47B 95/002 |
| 2020/0292123 A1 | 9/2020 | Huang et al. |

FOREIGN PATENT DOCUMENTS

| CN | 106163148 A | 11/2016 |
| TW | M589419 U | 1/2020 |

* cited by examiner

*Primary Examiner* — Bradley Duckworth
(74) *Attorney, Agent, or Firm* — McClure, Qualey & Rodack, LLP

(57) ABSTRACT

A bracket is provided. The bracket includes a fixing seat and a holding seat. The fixing seat has a first extending direction and includes at least one first contacting end surface, and a first angle is contained between the at least one first contacting end surface and the first extending direction. The holding seat is detachably connected to the fixing seat with a bend angle to form a bend structure, and the holding seat includes at least one second contacting end surface corresponding to the at least one first contacting end surface. The at least one first contacting end surface and the at least one second contacting end surface are located near or at a bend portion of the bend structure.

17 Claims, 6 Drawing Sheets

BRACKET

CROSS-REFERENCE TO RELATED PATENT APPLICATION

This application claims the benefit of priority to Taiwan Patent Application No. 111102429, filed on Jan. 20, 2022. The entire content of the above identified application is incorporated herein by reference.

BACKGROUND

Technical Field

The present disclosure relates to a bracket, and more particularly, to a bracket capable of holding and supporting an object.

Description of Related Art

With the advancement of technology, electronic devices are widely used. Because the electronic devices need to be connected to a network in order to receive and transmit signals, communication equipment is installed in an indoor environment to facilitate network connection.

Generally speaking, the communication equipment can be installed on the wall through an L-shaped bracket. However, the communication equipment has many wires, which causes installation difficulty and affects the overall esthetic appearance.

In view of this, a bracket that is easy to be installed and to hold object with multiple wires is an issue to be resolved by the related industry.

SUMMARY

It is an object of the present disclosure to provide a bracket with a fixing seat and a holding seat. The fixing seat has a first extending direction and includes at least one first contacting end surface. A first angle is contained between the first extending direction and the at least one first contacting end surface. The holding seat is detachably connected to the fixing seat with a bend angle to form a bend structure. The holding seat includes at least one second contacting end surface corresponding to the at least one first contacting end surface. The at least one first contacting end surface and the at least one second contacting end surface are located near or at a bend portion of the bend structure.

It is another object of the present disclosure to provide a bracket with a fixing seat and a holding seat. The fixing seat includes a fixing seat body and a first engaging structure disposed at one end of the fixing seat body. The holding seat is detachably connected to the fixing seat to form a bend structure. The holding seat includes a holding seat body and a second engaging structure disposed at one end of the holding seat body. The second engaging structure and the first engaging structure are assembled together, and are located near or at a bend portion of the bend structure.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
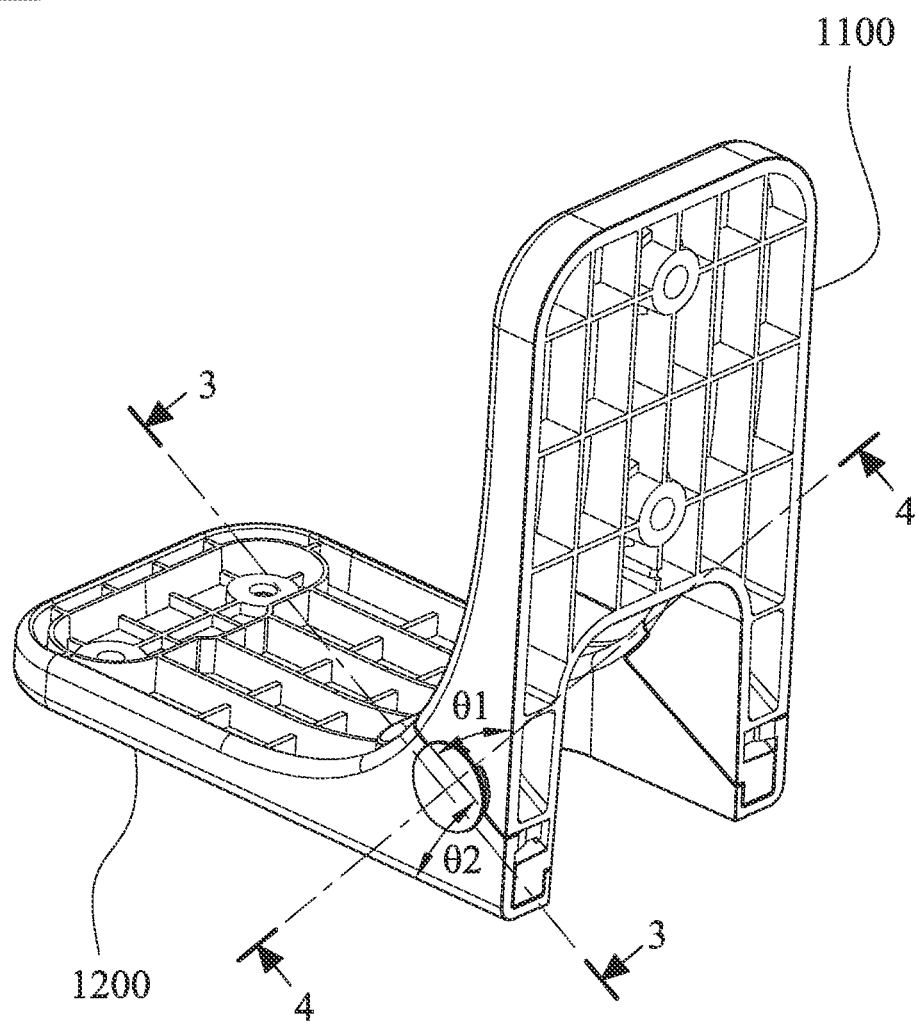
FIG. 1 is a schematic perspective view of a bracket according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
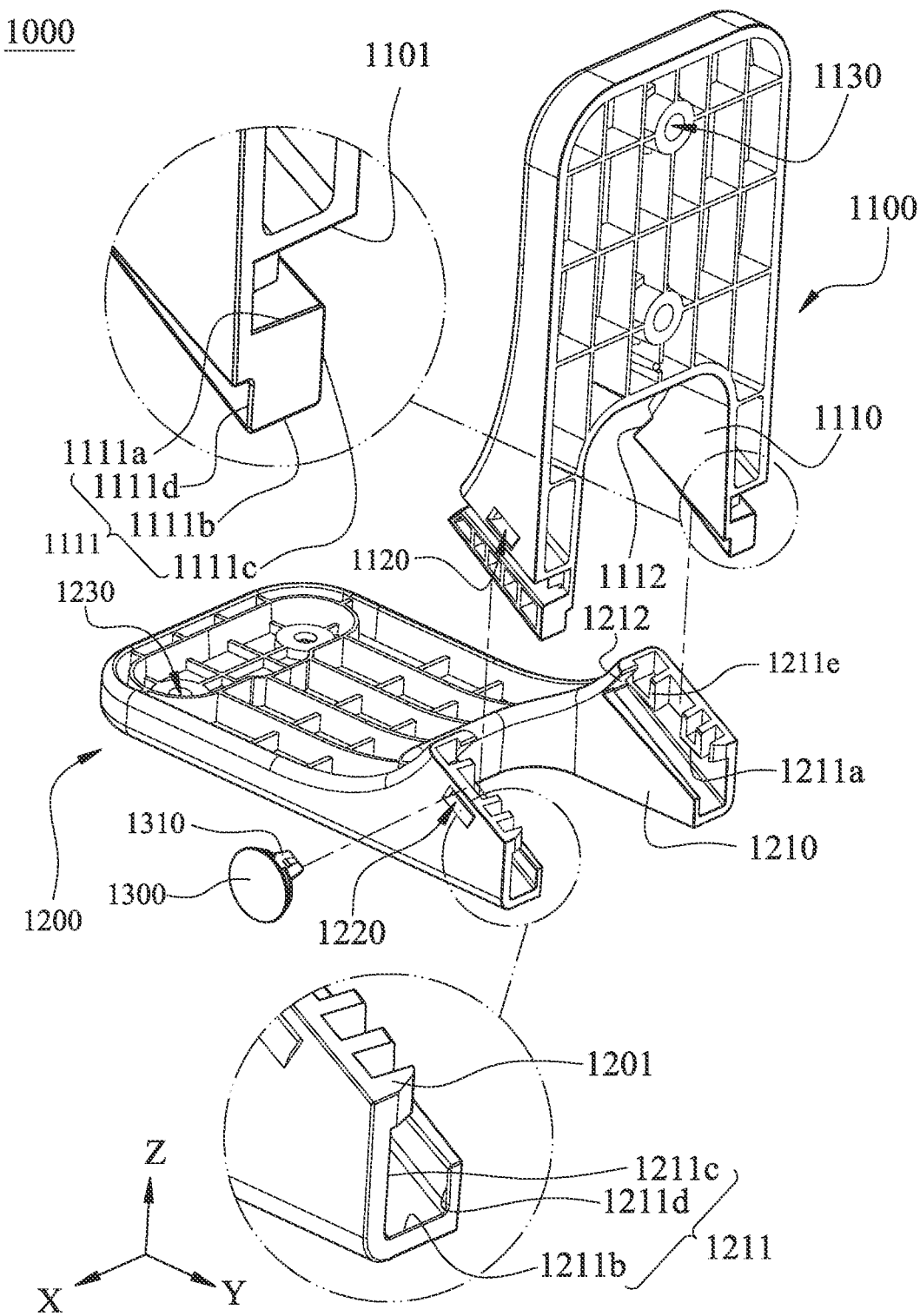
FIG. 2 is a schematic exploded view of the bracket in FIG. 1.

Referring to FIG. 1 and FIG. 2, a bracket 1000 includes a fixing seat 1100 and a holding seat 1200. The fixing seat 1100 has a first extending direction (for example, parallel to the Z-axis direction) and includes at least one first contacting end surface 1101, and a first angle θ1 is contained between the at least one first contacting end surface 1101 and the first extending direction. The holding seat 1200 and the fixing seat 1100 are detachably connected with a bend angle to form a bend structure. The holding seat 1200 includes at least one second contacting end surface 1201 that corresponds to the at least one first contacting end surface 1101. The at least one first contacting end surface 1101 and the at least one second contacting end surface 1201 are located near or at a bend portion C1 (shown in FIG. 6) of the bend structure.

Figure 6:
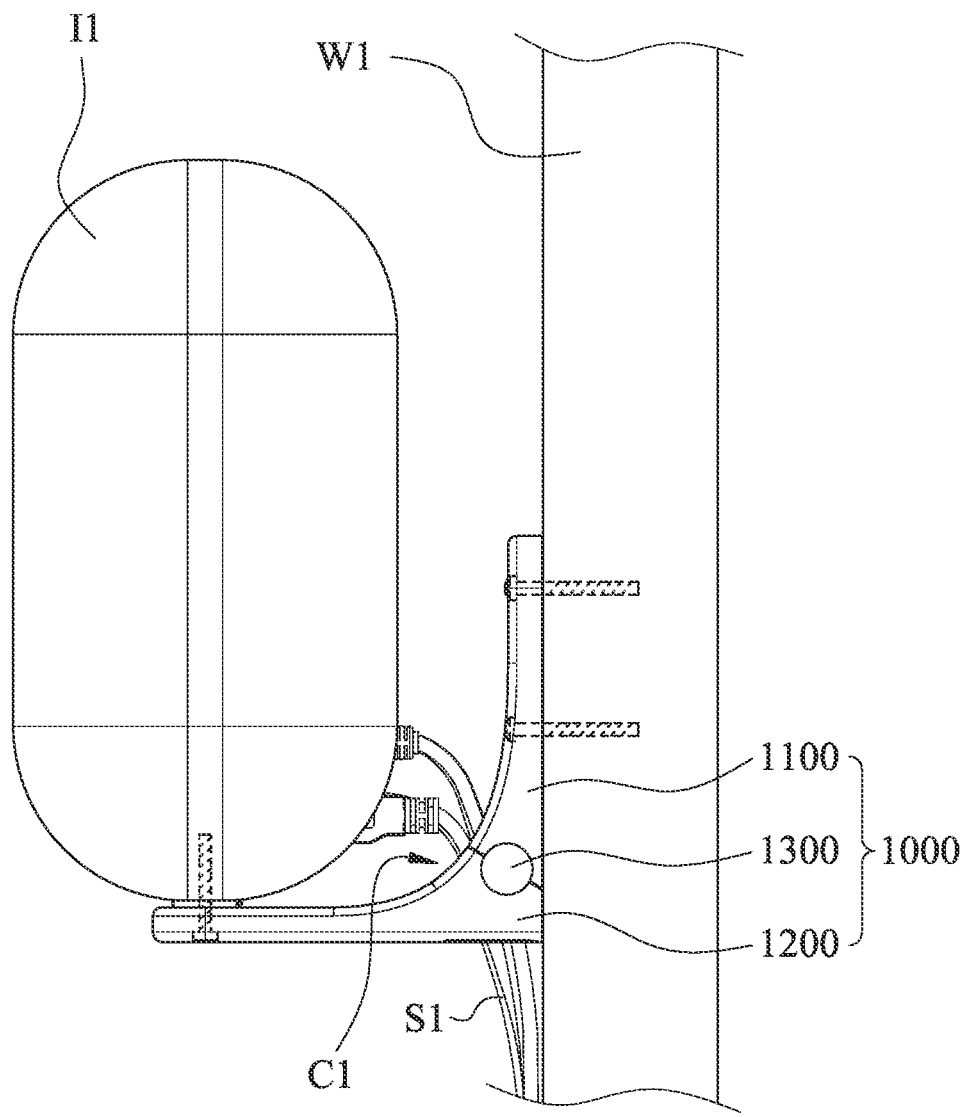
FIG. 6 is a schematic side view of the bracket in FIG. 1 installed on a wall and holding an object according.

Hence, the fixing seat 1100 is able to be fixed on a wall W1 (shown in FIG. 6), and the holding seat 1200 is configured to better facilitate the placement and holding of an object I1 (shown in FIG. 6). Through the structure which allows the holding seat 1200 to be detachably connected to the fixing seat 1100, the convenience in installation and maintenance is improved. Moreover, by the structural configurations of the first angle θ1 contained between the first contacting end surface 1101 and the first extending direction, the second contacting end surface 1201 corresponding to the first contacting end surface 1101, and the second contacting end surface 1201 and the first contacting end surface 1101 being near or at the bend portion C1, the stability of the fixing seat 1100 and the holding seat 1200 after assembly is enhanced. The details of the bracket 1000 will be described hereafter.

The fixing seat 1100 is a plate-like structure extending toward the first extending direction, and the holding seat 1200 also has a second extending direction (for example, parallel to the Y-axis direction) and is a plate-like structure extending toward the second extending direction. A second angle θ2 is contained between the at least one second contacting end surface 1201 and the second extending direction, and a sum of the first angle θ1 and the second angle θ2 is 90 degrees so that the bend angle of the bend structure is approximately 90 degrees. In other embodiments, the second extending direction may not be completely parallel to the Y-axis direction and can be set depending on the object to be placed, so that the bend angle is less than 90 degrees. In this embodiment, the first angle θ1 is between 10 degrees and 50 degrees, and is, for example, 30 degrees, but the present disclosure is not limited thereby.

Furthermore, a thickness (for example, in the Y-axis direction) of the fixing seat 1100 gradually expands toward the bend portion C1 along the first extending direction, and a thickness (for example, in the Z-axis direction) of the holding seat 1200 also gradually expands toward the bend portion C1 along the second extending direction. Thus, the area of the first contacting end surface 1101 and the area of the second contacting end surface 1201 are increased and thereby enhancing the stability.

Figure 3:
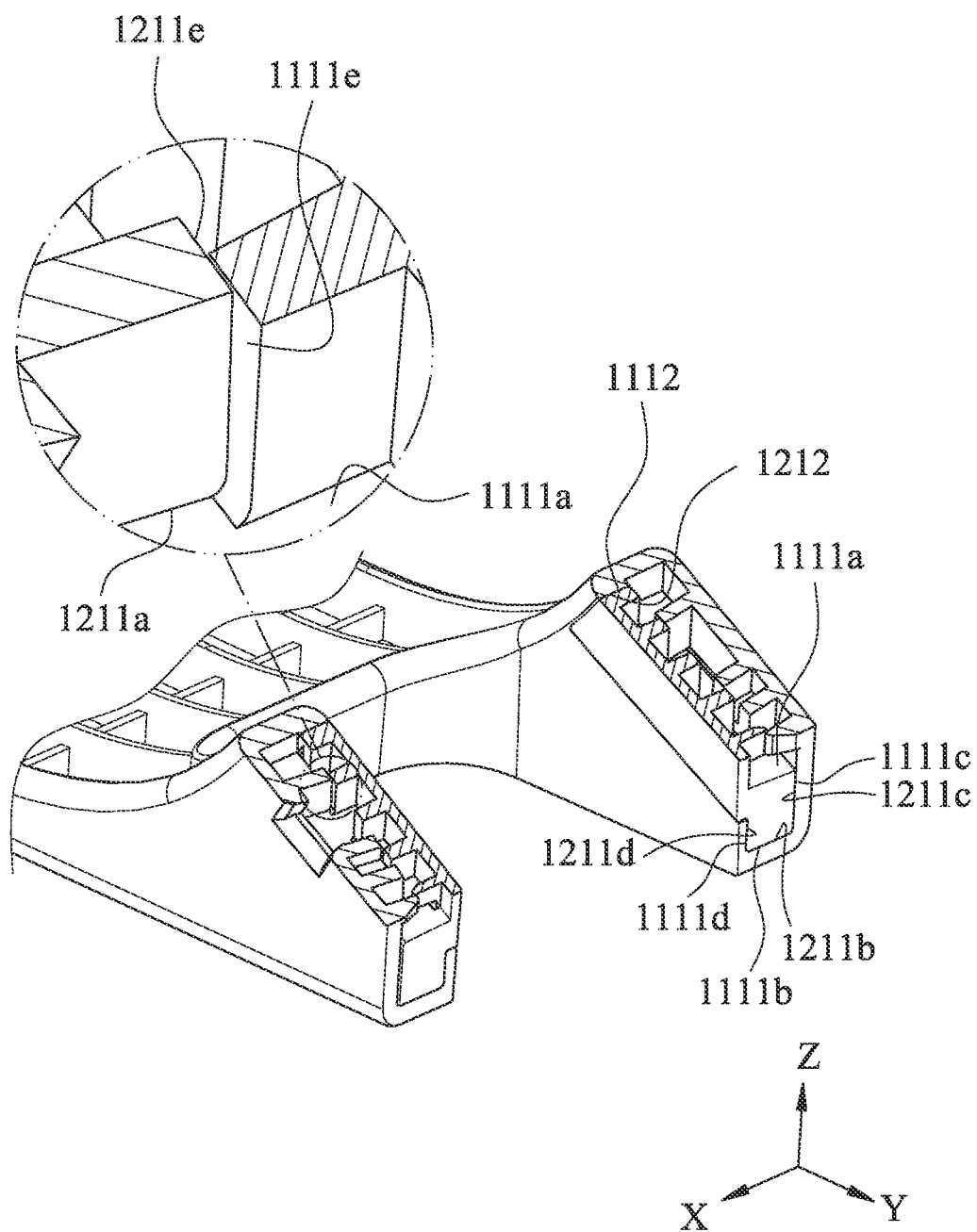
FIG. 3 is a schematic perspective cross-sectional view of the bracket in FIG. 1 taken along line 3-3.
Figure 4:
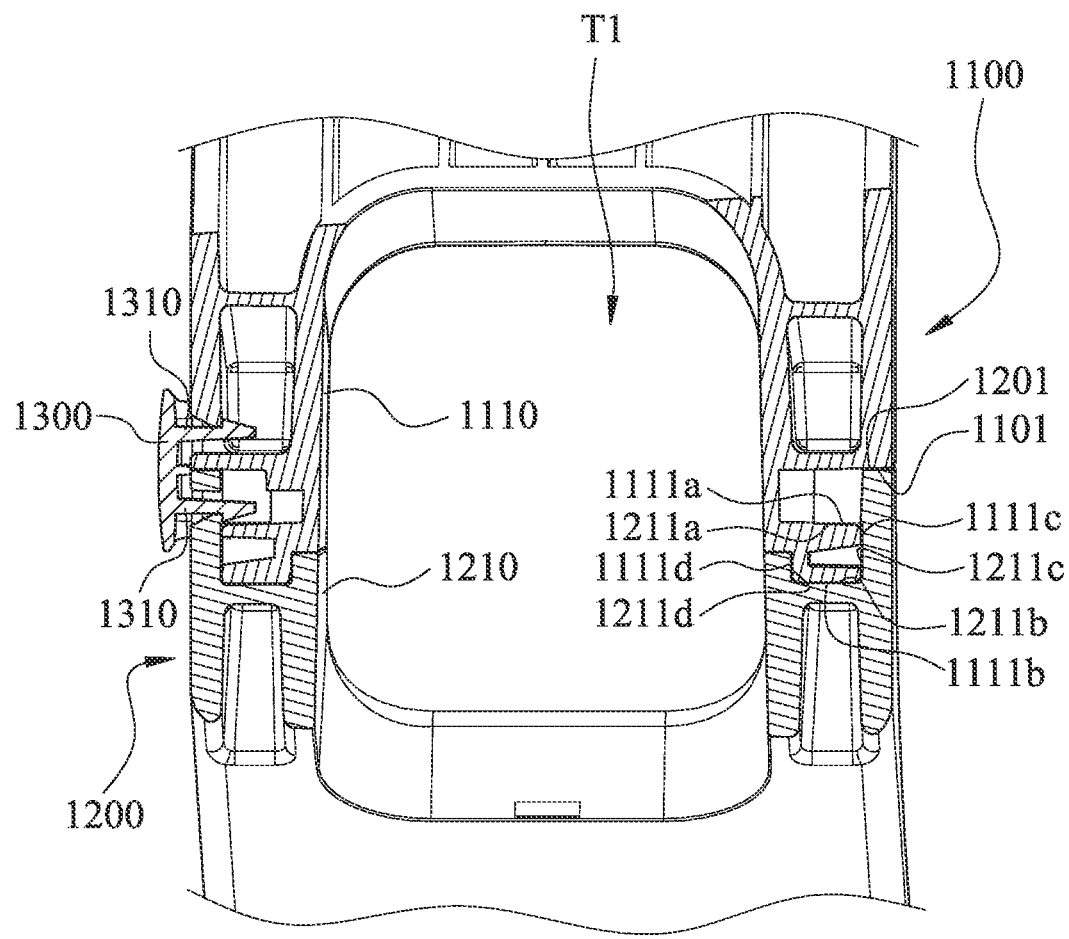
FIG. 4 is a schematic cross-sectional view of the bracket in FIG. 1 taken along line 4-4.
Figure 5:
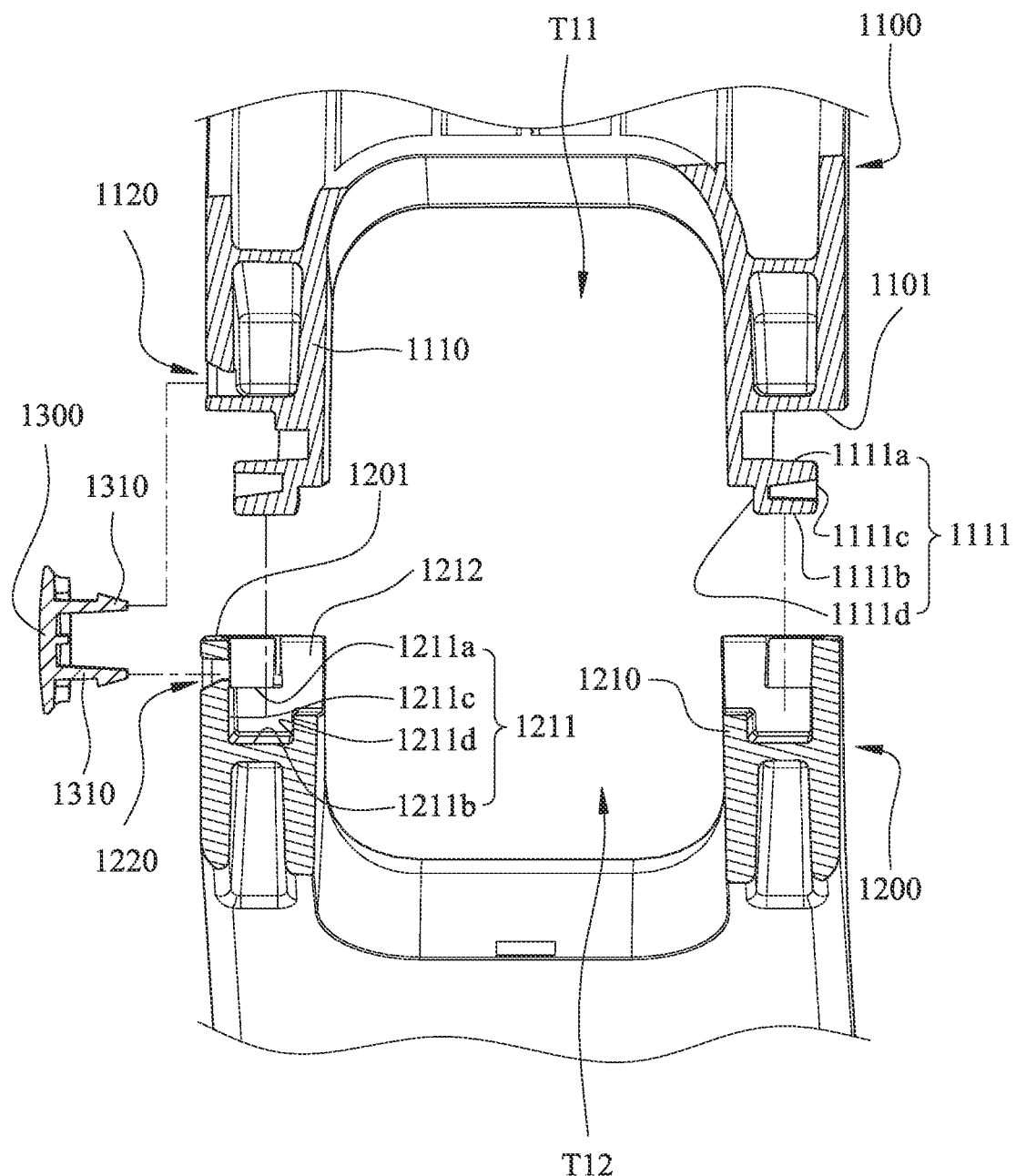
FIG. 5 is a schematic exploded cross-sectional view of the bracket in FIG. 4.

Referring further to FIG. 3, FIG. 4, and FIG. 5 with references to FIG. 1 and FIG. 2, the number of the at least one first contacting end surface 1101 is two, and the fixing seat 1100 includes two first legs 1110. The two first contacting end surfaces 1101 are respectively disposed on the two first legs 1110, and the two first legs 1110 are in a spaced-apart arrangement to form a first half-notch T11. The number of the at least one second contacting end surface 1201 is two, and the holding seat 1200 includes two second legs 1210. Each of the two second contacting end surfaces 1201 is respectively disposed on each of the two second legs 1210, and the two second legs 1210 are spaced apart and forming a second half-notch T12. When each of the first legs 1110 and each of the second legs 1210 are respectively assembled or connected, the first half-notch T11 and the second half-notch T12 correspondingly form an opening T1 that penetrates the bend structure.

Each of the first legs 1110 extends along the Z-axis direction and is spaced apart in the X-axis direction, and each of the second legs 1210 extends along the Y-axis direction and is spaced apart in the X-axis direction. During the assembling, the holding seat 1200 moves relative to the fixing seat 1100 along the first angle θ1 to slidably assemble each of the second legs 1210 to each of the first legs 1110.

In specific, each of the first legs 1110 includes a block 1111, and each of the second legs 1210 includes a channel 1211. When each of the second legs 1210 is assembled with each of the first legs 1110, each block 1111 is correspondingly accommodated in each channel 1211. In structural configuration, each block 1111 may be disposed below each of the first contacting end surfaces 1101, and each channel 1211 may be disposed under each of the second contacting end surfaces 1201, such that when each block 1111 is correspondingly accommodated in each channel 1211, each of the first contacting end surfaces 1101 abuts against each of the second contacting end surfaces 1201.

Also, each block 1111 includes an over-side 1111a, an external-side 1111c, and an under-side 1111b, and the external-side 1111c is connected between the over-side 1111a and the under-side 1111b. Each channel 1211 includes a top-side 1211a, an outer-side 1211c, and a bottom-side 1211b, and the outer-side 1211c is connected between the top-side 1211a and the bottom-side 1211b. When each block 1111 is correspondingly accommodated in each channel 1211, the over-side 1111a abuts the top-side 1211a, the external-side 1111c abuts the outer-side 1211c, and the under-side 1111b abuts the bottom-side 1211b.

More particularly, each block 1111 further includes an internal-side 1111d opposite to the external-side 1111c, and each channel 1211 further includes an inner-side 1211d opposite to the outer-side 1211c. Each internal-side 1111d abuts each inner-side 1211d. In other words, the block 1111 is approximately a polygon column surrounded by the over-side 1111a, the external-side 1111c, the under-side 1111b, and the internal-side 1111d, and the channel 1211 is approximately a polygon recess surrounded by the top-side 1211a, the outer-side 1211c, the bottom-side 1211b, and the inner-side 1211d. The channel 1211 and the block 1111 correspond to each other. Because the over-side 1111a, the under-side 1111b, the top-side 1211a, and the bottom-side 1211b provide limitation on the degrees of freedom in the Z-axis direction and the Y-axis direction, and the external-side 1111c, the internal-side 1111d, the outer-side 1211c, and the inner-side 1211d provide limitation on the degree of freedom in the X-axis direction, the stability and the structural strength of the bracket 1000 are enhanced.

As shown in FIG. 2 and FIG. 3, each of the first legs 1110 further includes a first abutting surface 1111e, and the first abutting surface 1111e is connected between the over-side 1111a and the first contacting end surface 1101 to form a first butting protrusion. Each second leg 1210 further includes a second abutting surface 1211e, and each second abutting surface 1211e is connected between each second contacting end surface 1201 and each top-side 1211a to form a second abutting protrusion. Each first abutting protrusion corresponds to each second abutting protrusion, and each first abutting surface 1111e abuts each second abutting surface 1211e.

More specifically, there is a gap between each first contacting end surface 1101 and each block 1111, and the first abutting protrusion of each first leg 1110 is formed in the gap. A length of the first abutting protrusion in the X-axis direction is smaller than a length of the over-side 1111a in the X-axis direction. The second abutting protrusion is disposed above the channel 1211, and a length of the second abutting protrusion in the X-axis direction is equal to the length of the top-side 1211a in the X-axis direction but smaller than the length of the bottom-side 1211b in the X-axis direction.

When assembling each first leg 1110 to each second leg 1210, the second abutting protrusion enters the gap between each first contacting end surface 1101 and each block 1111 to correspond with each first abutting protrusion. Therefore, the limitation on the degree of freedom in the X-axis direction is further enhanced through the abutment between each first abutting surface 1111e and each second abutting surface 1211e. It is to be noted that although FIG. 2 and FIG. 3 illustrate a plurality of first abutting protrusions and a plurality of second abutting protrusions, it is possible that only some of the first abutting protrusions and some of the second abutting protrusions abut correspondingly, or all of the first abutting protrusions and all of the second abutting protrusions abut, or only one first abutting protrusion and one second abutting protrusion are disposed, and the present disclosure is not limited thereby.

In addition, each first leg 1110 further includes a first restricting end surface 1112, and each second leg 1210 further includes a second restriction end surface 1212. When assembling each first leg 1110 and each second leg 1210 by sliding each channel 1211 relative to each first leg 1110, each first restricting end surface 1112 abuts against each second restricting end surface 1212 to prevent each second leg 1210 from sliding relative to each first leg 1110. The first restricting end surface 1112 has an included angle with the Z-axis and another included angle with the Y-axis, and the second restricting end surface 1212 also has an included angle with the Z-axis and another included angle with the Y-axis. Through the combination of the first restricting end surface 1112 and the second restricting end surface 1212, the sliding of each second leg 1210 is stopped and each second leg 1210 is stably assembled with each first leg 1110.

Referring to FIG. 2, FIG. 4, and FIG. 5, the bracket 1000 further includes at least one fastening member 1300. The fastening member 1300 includes at least two leg portions 1310. The fixing seat 1100 further includes at least one first insertion hole 1120, and the at least one first insertion hole 1120 is disposed at at least one of the two first legs 1110. The holding seat 1200 further includes at least one second insertion hole 1220, and the at least one second insertion hole 1220 is disposed at at least one of the two second legs 1210. The at least two leg portions 1310 are respectively inserted into the at least one first insertion hole 1120 and the at least one second insertion hole 1220.

The number of the fastening member 1300 can be one, and the number of the leg portions 1310 can be two. The number of the first insertion hole 1120 is also one, and the first insertion hole 1120 is disposed at one of the first legs 1110. The number of the second insertion hole 1220 is one as well, and the second insertion hole 1220 is disposed at the second leg 1210 that corresponds to the first leg 1110 having the first insertion hole 1120. When each first leg 1110 and each second leg 1210 are assembled together, the two leg portions 1310 are respectively inserted into the first insertion hole 1120 of the first leg 1110 and the second insertion hole 1220 of the second leg 1210, thereby ensuring the stability of the connection between the fixing seat 1100 and the holding seat 1200.

Further referring to FIG. 6, which illustrates the bracket 1000 being installed on a wall W1 and placed with an object I1, the fixing seat 1100 is used to be fastened to and fixed on the surface of the wall W1, and the holding seat 1200 is used for placing and holding the object I1. Hence, the bracket 1000 is able to place the object I1 on the wall W1.

Therefore, the fixing seat 1100 further includes at least one first fastening hole 1130 for accommodating at least one fastener so as to connect the fixing seat 1100 to the wall W1, and the holding seat 1200 further includes at least one second fastening hole 1230 for accommodating at least one fastener so as to affix the object I1 on the holding seat 1200. The wires S1 of the object I1 are able to pass through the opening T1, so the convenience in installation is provided. During installation, after the fixing seat 1100 is affixed to the wall W1, the object I1 is fastened to the holding seat 1200 with the wires S1 placed in the second half-notch T12, and then the second leg 1210 is connected to the first leg 1110 by sliding and with the wires S1 corresponding to the first half-notch T11, so that the wires S1 remain in the opening T1 after the assembly. Hence, the bracket 1000 is convenient for installing and assembling the object I1 with the wires S1.

It is to be noted that for the present disclosure, the bracket includes a fixing seat and a holding seat. The fixing seat is considered to have a fixing seat body and a first engaging structure, and the first engaging structure is located at one end of the fixing seat body. The holding seat is considered to have a holding seat body and a second engaging structure, and the second engaging structure is located at one end of the holding seat body. The holding seat and the fixing seat are detachably connected to form a bend structure. The second engaging structure and the first engaging structure are assembled together and the two assembled engaging structures, i.e., the first engaging structure and the second engaging structure, or the assembly, is near or at a bend portion of the bend structure. The first engaging structure includes a first contacting end surface and a first leg, and the second engaging structure includes a second contacting end surface and a second leg. Through the structural configurations of the first contacting end surface cooperating with the second contacting end surface, the block on the first leg cooperating with the channel on the second leg, and the first abutting protrusion of the first leg abutting against the second abutting protrusion of the second leg, the holding seat and the fixing seat are stably connected. Moreover, the structural configuration of the first angle and the second angle amounting to 90 degrees allows the bend angle of the bend structure to be approximately 90 degrees and the first angle to be preferably between 10 degrees and 50 degrees, but the present disclosure is not limited thereto.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A bracket comprising:
 a fixing seat, comprising a first extending direction and at least one first contacting end surface, wherein a first angle is contained between the first extending direction and the at least one first contacting end surface; and
 a holding seat, detachably connected to the fixing seat to form a bend structure with a bend angle and comprising at least one second contacting end surface corresponding to the at least one first contacting end surface, wherein the holding seat comprises a second extending direction, and a second angle is contained between the at least one second contacting end surface and the second extending direction;
 wherein the at least one first contacting end surface and the at least one second contacting end surface are located near or at a bend portion of the bend structure, and the at least one first contacting end surface parallelly contacts the at least one second contacting end surface.

2. The bracket according to claim 1, wherein the bend angle is approximately 90 degrees.

3. The bracket according to claim 1, wherein a number of the at least one first contacting end surface is two, the fixing seat comprises two first legs, each of the two first contacting end surfaces is located on each of the two first legs, the two first legs are spaced apart to form a first half-notch, a number of the at least one second contacting end surface is two, the holding seat comprises two second legs, each of the two second contacting end surfaces is disposed on each of the two second legs, the two second legs are spaced apart to form a second half-notch, and when each of the two first legs is assembled with each of the two second legs, the first half-notch and the second half-notch correspondingly form an opening penetrating the bend structure.

4. The bracket according to claim 3, wherein each of the two second legs is slidably assembled with each of the two first legs.

5. The bracket according to claim 4, wherein each of the two first legs comprises a block, each of the two second legs comprises a channel, and when each of the two second legs is assembled with each of the two first legs, each of the blocks is correspondingly accommodated in each of the channels.

6. The bracket according to claim 5, wherein each of the blocks comprises an over-side, an external-side, and an under-side, each of the external-sides is connected between each of the over-sides and each of the under-sides, each of the channels comprises a top-side, an outer-side, and a bottom-side, each of the outer-sides is connected between each of the top-sides and each of the bottom-sides, and when each of the blocks is correspondingly accommodated in each of the channels, each of the over-sides correspondingly abuts each of the top-sides, each of the external-sides correspondingly abuts each of the outer-sides, and each of the under-sides correspondingly abuts each of the bottom-sides.

7. The bracket according to claim 6, wherein each of the two first legs further comprises a first abutting surface, each of the first abutting surfaces is connected between each of the over-sides and each of the first contacting end surfaces to form a first abutting protrusion, each of the two second legs further comprises a second abutting surface, each of the second abutting surfaces is connected between each of the top-sides and each of the second contacting end surfaces to form a second abutting protrusion, each of the first abutting protrusions corresponds to each of the second abutting protrusions, and each of the first abutting surfaces abuts against each of the second abutting surfaces.

8. The bracket according to claim 7, wherein each of the two first legs further comprises a first restricting end surface, each of the two second legs further comprises a second restricting end surface, and when the channel of each of the two second legs slides relative to each of the two first legs to assemble each of the first legs and each of the second legs, each of the first restricting end surfaces abuts against each of the second restricting end surfaces to prevent each of the second legs from sliding relative to each of the first legs.

9. The bracket according to claim 7, wherein each of the blocks further comprises an internal-side opposite to the external-side, each of the channels further comprises an inner-side opposite to the outer-side, and each of the internal-sides correspondingly abuts each of the inner-sides.

10. The bracket according to claim 3, further comprising at least one fastening member, wherein the at least one fastening member comprises at least two leg portions, the fixing seat further comprises at least one first insertion hole located at at least one of the two first legs, the holding seat further comprises at least one second insertion hole located at at least one of the two second legs, and the at least two leg portions are respectively inserted into the at least one first insertion hole and the at least one second insertion hole.

11. The bracket according to claim 1, wherein a thickness of the fixing seat gradually expands toward the bend portion along the first extending direction, and a thickness of the holding seat gradually expands toward the bend portion along the second extending direction.

12. The bracket according to claim 1, wherein the fixing seat is configured to be secured to a wall.

13. The bracket according to claim 1, wherein the holding seat is configured to hold an object.

14. A bracket comprising:
a fixing seat, comprising a fixing seat body and a first engaging structure disposed at one end of the fixing seat body, wherein the first engaging structure comprises at least one first inclined end surface; and
a holding seat, detachably connected to the fixing seat to form a bend structure and comprising a holding seat body and a second engaging structure disposed at one end of the holding seat body, wherein the second engaging structure comprises at least one second inclined end surface corresponding to the at least one first inclined end surface;
wherein the second engaging structure and the first engaging structure are assembled together, and are located near or at a bend portion of the bend structure.

15. The bracket according to claim 14, wherein a bend angle of the bend structure is approximately 90 degrees.

16. The bracket according to claim 14, wherein a first angle contained between a first extending direction of the fixing seat and the at least one first inclined end surface is between 10 degrees and 50 degrees.

17. A bracket comprising:
a fixing seat, comprising a fixing seat body, a first extending direction and a first engaging structure disposed at one end of the fixing seat body, wherein the first engaging structure comprises at least one first contacting end surface, and a first angle is contained between the at least one first contacting end surface and the first extending direction; and
a holding seat, detachably connected to the fixing seat to form a bend structure and comprising a holding seat body, a second extending direction and a second engaging structure disposed at one end of the holding seat body, wherein the second engaging structure comprises at least one second contacting end surface, and a second angle is contained between the at least one second contacting end surface and the second extending direction;
wherein the second engaging structure and the first engaging structure are assembled together and are located near or at a bend portion of the bend structure, a sum of the second angle and the first angle is 90 degrees, and a bend angle of the bend structure is 90 degrees.

* * * * *